United States Patent
Lee

(10) Patent No.: US 9,093,443 B2
(45) Date of Patent: Jul. 28, 2015

(54) TAPE PACKAGE AND FLAT PANEL DISPLAY DEVICE INCLUDING THE SAME

(71) Applicant: Samsung Display Co., Ltd., Yongin, Gyeonggi-Do (KR)

(72) Inventor: Hee-Jin Lee, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 14/181,663

(22) Filed: Feb. 15, 2014

(65) Prior Publication Data

US 2014/0233249 A1    Aug. 21, 2014

(30) Foreign Application Priority Data

Feb. 18, 2013    (KR) .................. 10-2013-0017052

(51) Int. Cl.
| | |
|---|---|
| H01L 23/498 | (2006.01) |
| F21K 99/00 | (2010.01) |
| H05K 1/02 | (2006.01) |
| H05K 1/18 | (2006.01) |
| H05K 3/28 | (2006.01) |

(52) U.S. Cl.
CPC .............. *H01L 23/4985* (2013.01); *F21K 9/00* (2013.01); *H05K 1/0281* (2013.01); *H01L 23/49855* (2013.01); *H01L 2224/16225* (2013.01); *H01L 2224/32225* (2013.01); *H01L 2224/73204* (2013.01); *H01L 2924/01078* (2013.01); *H01L 2924/14* (2013.01); *H05K 1/189* (2013.01); *H05K 3/28* (2013.01); *H05K 2201/10128* (2013.01); *H05K 2201/10681* (2013.01)

(58) Field of Classification Search
CPC ........................... H05K 1/181; H01L 23/4985
USPC ............ 257/668, 666, E23.05, E23; 362/382;
174/254, 260, 268
See application file for complete search history.

(56) References Cited

U.S. PATENT DOCUMENTS

| | | | | |
|---|---|---|---|---|
| 6,211,936 | B1 * | 4/2001 | Nakamura | 349/152 |
| 2007/0034402 | A1 * | 2/2007 | Cheng | 174/260 |
| 2011/0193478 | A1 * | 8/2011 | Kim | 315/32 |
| 2011/0247863 | A1 | 10/2011 | Watanabe | |

FOREIGN PATENT DOCUMENTS

| | | |
|---|---|---|
| KR | 10-0659826 | 12/2006 |
| KR | 10-2007-0019358 | 2/2007 |

* cited by examiner

*Primary Examiner* — Yu-Hsi D Sun
*Assistant Examiner* — Charles R Peters
(74) *Attorney, Agent, or Firm* — Robert E. Bushnell, Esq.

(57) ABSTRACT

Provided are a tape package and a flat panel display device including the tape package. The tape package includes a base film, a semiconductor chip mounted on one surface of the base film, a wire pattern including an input wire pattern and an output wire pattern formed on one surface of the base film and electrically connected with the semiconductor chip, a solder resist covering the remaining portion, except for an end of the wire pattern, and a protection film provided on an edge at one side of the solder resist facing an end of the output wire pattern.

16 Claims, 8 Drawing Sheets

TAPE PACKAGE AND FLAT PANEL DISPLAY DEVICE INCLUDING THE SAME

CLAIM OF PRIORITY

This application makes reference to, incorporates the same herein, and claims all benefits accruing under 35 U.S.C. §119 from an application earlier filed in the Korean Intellectual Property Office on 18 Feb. 2013 and there duly assigned Serial No. 10-2013-0017052.

BACKGROUND OF THE INVENTION

1. Field of the Invention

An embodiment of the present invention relates generally to a tape package and a flat panel display device including the same, and more particularly, to a tape package capable of suppressing generation of a crack and a short circuit of a wire pattern due to bending, and a flat panel display device including the same.

2. Description of the Related Art

In a flat panel display device, a display panel and a printed circuit board are connected by using a tape package, which is a driving chip (drive IC) component. The tape package includes a tape carrier package (TCP) and a chip on film (COF) package. Among them, the chip on film package has a structure in which a semiconductor chip is mounted in a tape wire substrate having no window by a flip chip bonding method.

The general chip on film package includes a semiconductor chip in which an electrode bump is formed, and a tape wire substrate to which a semiconductor chip is bonded through the electrode bump. The tape wire substrate includes a base film, a wire pattern formed on one surface of the base film, and a solder resist covering the wire pattern to protect the wire pattern. One end of the wire pattern is electrically connected with the semiconductor chip through the electrode bump, and an opposite end is exposed to the exterior of the solder resist.

A portion exposed to the exterior of the solder resist in the wire pattern is electrically connected with a display panel or a printed circuit board by an anisotropic conductive film (ACF). The tape package is attached to the display panel and then is bent in an opposite direction of a display surface, so that the printed circuit board overlaps the display panel.

In this case, in the tape package, the wire pattern and the solder resist may be bent so as to face the exterior of the tape package according to a light emission method of the display panel. In this case, the wire pattern and the solder resist have a structure vulnerable to a crack. Further, a failure may occur when the wire pattern becomes in contact with a structure which causes a short circuit while the solder resist peels off during a process of fastening the structure, such as a chassis, to an external side of the tape package.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention has been made in an effort to provide a tape package capable of suppressing generation of a crack of a wire pattern and a short circuit by improving vulnerability of the tape package to bending, and preventing a solder resist from peeling off due to fastening of a structure, and a flat panel display device including the same.

An exemplary embodiment of the present invention provides a tape package including: a base film; a semiconductor chip mounted on one surface of the base film; a wire pattern including an input wire pattern and an output wire pattern formed on one surface of the base film and electrically connected with the semiconductor chip; a solder resist covering the remaining portion, except for an end of the wire pattern; and a protection film provided on an edge at one side of the solder resist facing an end of the output wire pattern.

The protection film may have the same length as that of the edge at the one side of the solder resist, and may be positioned throughout an upper surface and a side surface of the solder resist and an upper surface of the base film. The base film may be bent so that one surface on which the wire pattern and the solder resist are formed faces the outside, and at least a part of the protection film may be positioned at a bent portion of the base film.

The protection film may include: a first protection film provided on the edge at one side of the solder resist facing the end of the output wire pattern; and a second protection film provided on the solder resist so as to correspond to a fine pitch portion of the wire pattern. The fine pitch portion may be included in each of the input wire pattern and the output wire pattern, and the second protection film may be individually positioned at each fine pitch portion.

The protection film may be provided on an entire upper surface of the solder resist. The protection film may be formed to have a larger width than that of the solder resist in a lengthwise direction of the wire pattern to cover a part of the input wire pattern and the output wire pattern.

The protection film may be integrally fixed to the solder resist and the base film by thermocompression bonding.

Another exemplary embodiment of the present invention provides a flat panel display device including: a display panel including a first substrate and a second substrate; a printed circuit board configured to transmit a control signal to the display panel; and a tape package having one end bonded to the first substrate and the other end bonded to the printed circuit board, and bent toward an external surface of the second substrate so that the printed circuit board faces the second substrate. The tape package may include a base film including a wire pattern, a semiconductor chip, and a solder resist on one surface facing the outside, and a protection film covering an edge at one side of the solder resist at a bent portion of the base film.

The wire pattern may include an input wire pattern electrically connected with the printed circuit board, and an output wire pattern electrically connected with the display panel, and the protection film may be provided on the edge at one side of the solder resist facing the end of the output wire pattern.

On the other hand, the protection film may include: a first protection pattern provided on the edge at one side of the solder resist facing the end of the output wire pattern; and a second protection film provided on the solder resist so as to correspond to a fine pitch portion of the wire pattern. The fine pitch portion may be included in each of the input wire pattern and the output wire pattern, and the second protection film may be individually positioned on the every fine pitch portion.

On the other hand, the protection film may be provided on an entire external surface of the solder resist. The protection film may be formed to have a larger width than that of the solder resist in a lengthwise direction of the wire pattern to cover a part of the input wire pattern and the output wire pattern.

The protection film may be integrally fixed to the solder resist and the base film by thermocompression bonding. The display panel device may be an organic light emitting display panel including a plurality of organic light emitting diodes (OLED).

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Hereinafter, the present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Throughout the specification, unless explicitly described to the contrary, the word "comprise" and variations such as "comprises" or "comprising", will be understood to imply the inclusion of stated elements but not the exclusion of any other elements. Further, through the specification, it will be understood that when an element such as a layer, film, region, or substrate is referred to as being "on" another element, it can be directly on the other element or intervening elements may also be present. Further, the word "on" means positioning on or below the object portion, but does not essentially mean positioning on the upper side of the object portion based on a gravity direction.

Figure 1:
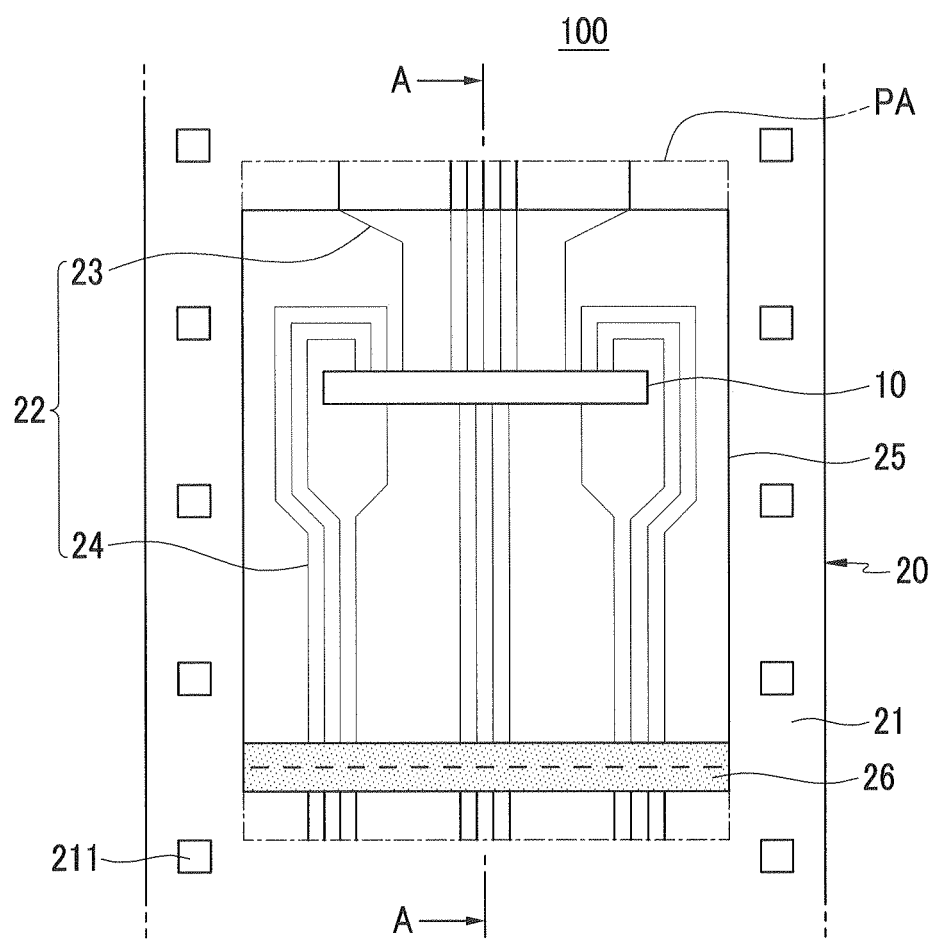
FIG. 1 is a top plan view of a tape package according to the first exemplary embodiment.
Figure 2:
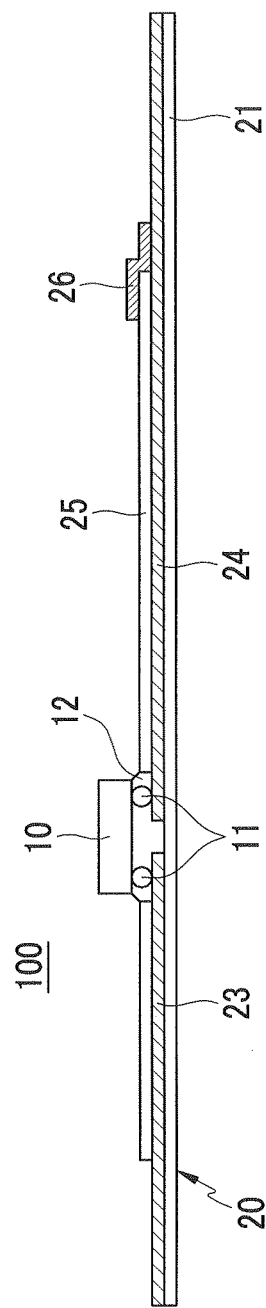
FIG. 2 is a cross-sectional view of the tape package taken along line A-A of FIG. 1.

FIG. 1 is a top plan view of a tape package according to the first exemplary embodiment, and FIG. 2 is a cross-sectional view of the tape package taken along line A-A of FIG. 1.

In reference to FIGS. 1 and 2, the tape package 100 of the first exemplary embodiment includes a semiconductor chip 10 forming an electrode bump 11, and a tape wire substrate 20 in which the semiconductor chip 10 is mounted through the electrode bump 11.

The tape wire substrate 20 includes a base film 21, a wire pattern 22 formed on one surface of the base film 21, and a solder resist 25 covering the remaining portion, except for an end of the wire pattern 22 to protect the wire pattern 22. The wire pattern 22 includes an input wire pattern 23 and an output wire pattern 24 positioned at opposite sides with the semiconductor chip 10 interposed therebetween. Further, a protective film 26 is attached on an edge of one side of the solder resist 25 facing an end of the output wire pattern 24.

More particularly, the semiconductor chip 10 is provided with the electrode bump 11 formed at an edge portion of an active surface, and is bonded to an upper surface of the base film 21 through the electrode bump 11 by a flip chip method. A portion to which the semiconductor chip 10 is bonded is protected from an outside environment by a resin layer 12 filled by an underfill method. The resin layer 12 serves to suppress a failure due to a difference of a coefficient of thermal expansion between the semiconductor chip 10 and the base film 21.

The base film 21 is formed of a polymer film, such as polyimide, and sprocket holes 211 are formed along both edges of the base film 21 at a predetermined interval. The semiconductor chip 10 is vertically disposed to a direction in which the sprocket holes 211 are arranged. When the tape package 100 is used in the flat panel display device, the edge portion of the base film 21 in which the sprocket holes 211 are formed is removed, so that only a package area PA is used.

The input wire pattern 23 is positioned at one side of the semiconductor chip 10, and the output wire pattern 24 is positioned at the other side of the semiconductor chip 10. The input wire pattern 23 and the output wire pattern 24 are generally formed in parallel to the direction in which the sprocket holes 211 are arranged. The wire pattern 22 may be formed of a copper wire plated with gold or tin.

One end of the input wire pattern 23 is connected with the electrode bump 11, and an opposite end of the input wire pattern 23 is positioned along an edge of one side of the package area PA. One end of the output wire pattern 24 is connected with the electrode bump 11, and an opposite end of the output wire pattern 24 is positioned along an edge of the other side of the package area PA. The input wire pattern 23 is later connected with pad electrodes of the printed circuit board, and the output wire pattern 24 is later connected with pad electrodes of the display panel.

The solder resist 25, which is an insulation protective layer, covers and protects the remaining regions, except for the ends of the input wire pattern 23 and the output wire pattern 24. Further, the protective film 26 is attached on the edge at one side of the solder resist 25 facing the end of the output wire pattern 24. The protective film 26, which is a polymer film, may be formed of a material that is the same as or different from that of the base film 21.

The protective film 26 may be formed to have the same length as that of the edge of the solder resist 25 along a direction perpendicular to the wire pattern 22. Further, the protective film 26 may be formed to have a predetermined width (see FIG. 2) so as to cover an upper surface and a side surface of the solder resist 25 and an upper surface of the base film 21 on which the wire pattern 22 is formed in a direction parallel to the wire pattern 22.

The protective film 26 may be integrally bonded to the tape wire substrate 20 by a thermocompression bonding process without using a separate adhesive. In this case, adherence of the protective film 26 for the tape wire substrate 20 may be improved, and the tape package 100 including the protective film 26 may be easily manufactured by using an automatic facility without adding a complex process.

One end of the aforementioned tape package 100 is bonded to the display panel, and an opposite end of the aforementioned tape package 100 is bonded to the printed circuit board and then bent, so that the printed circuit board is positioned at an opposite side of a display surface of the display panel. In this case, an upper surface of the tape package 100, on which the solder resist 25 and the wire pattern 22 are formed, may be bent toward the exterior of the tape package 100.

Figure 3:
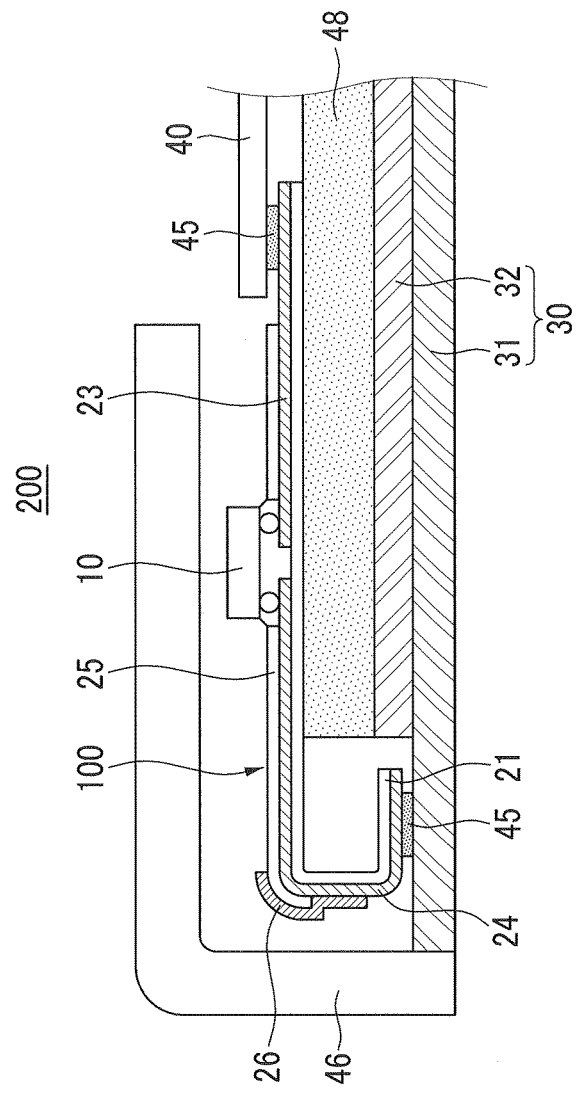
FIG. 3 is a cross-sectional view of a flat panel display device according to a second exemplary embodiment including the tape package illustrated in FIG. 1.

FIG. 3 is a cross-sectional view of a flat panel display device according to a second exemplary embodiment including the tape package illustrated in FIG. 1.

In reference to FIG. 3, the flat panel display device 200 of the second exemplary embodiment includes a display panel 30, a printed circuit board 40, on which a control circuit transmitting a control signal to the display panel 30 is formed, and the tape package 100 electrically and physically connecting the display panel 30 and the printed circuit board 40.

The one end of the tape package 100 at which an end of the input wire pattern 23 is exposed is fixed to the printed circuit board 40 by an anisotropic conductive film 45, and the input wire pattern 23 is electrically connected with pad electrodes (not illustrated) of the printed circuit board 40. An opposite side end of the tape package 100 at which an end of the output wire pattern 24 is exposed is fixed to the display panel 30 by an anisotropic conductive film 45, and the output wire pattern 24 is electrically connected to pad electrodes (not illustrated) of the display panel 30.

The display panel 30 includes a first substrate 31 and a second substrate 32, and the display surface of the display panel 30, from which light is emitted, may be an external surface (lower surface) of the first substrate 31. The display panel 30 may be an organic light emitting display panel including a plurality of organic light emitting diodes (OLED), and a touch screen panel (not illustrated) sensing a touch motion of a user may be positioned at an external side of the display surface of the display panel 30. In FIG. 3, reference numeral 48 denotes a buffer member.

Figure 4:
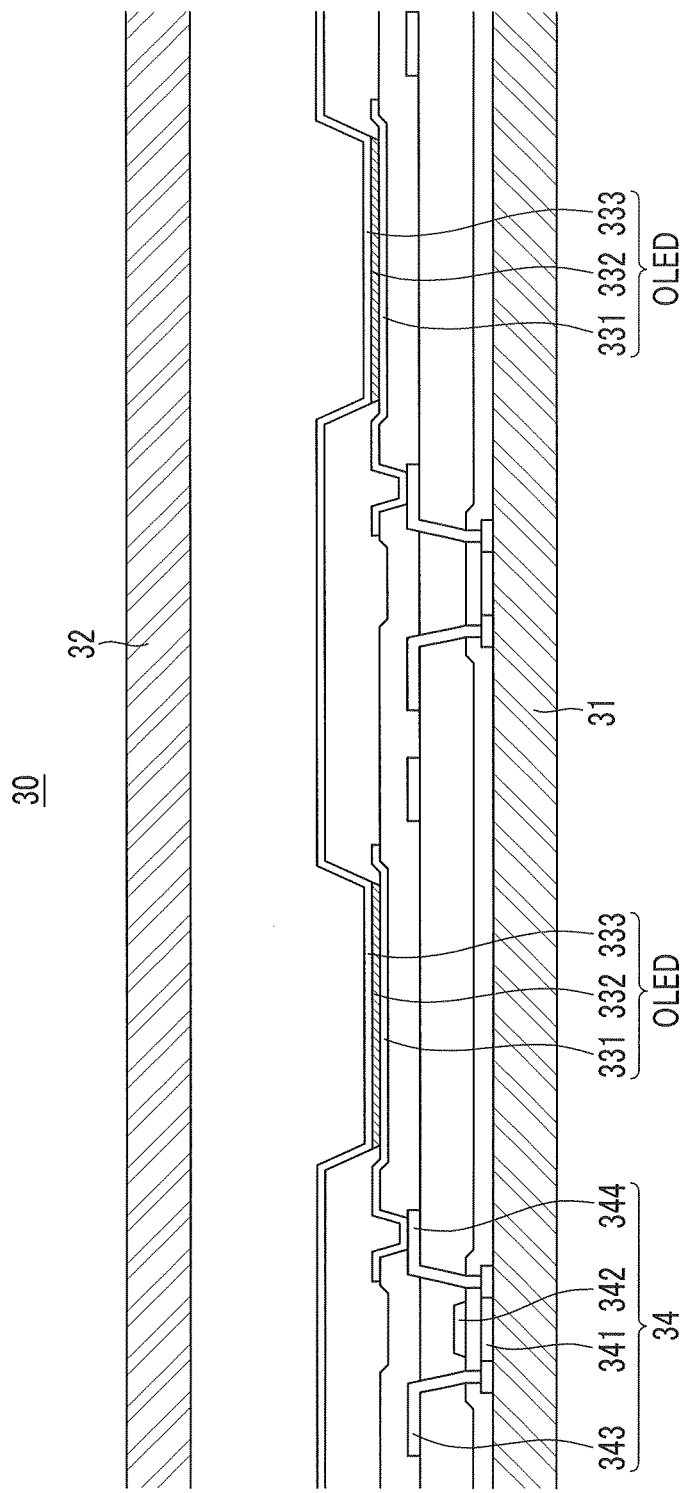
FIG. 4 is a cross-sectional view illustrating an internal side of the display panel illustrated in FIG. 3.

FIG. 4 is a cross-sectional view illustrating an internal side of the display panel illustrated in FIG. 3. The display panel 30 is not limited to a structure to be described below, and may also be formed of an organic light emitting display panel having a different structure or a liquid crystal display panel.

In reference to FIGS. 3 and 4, the display panel 30 includes the first substrate 31, the plurality of organic light emitting diodes (OLEDs) formed on the first substrate 31, and the second substrate 32 fixed to the first substrate 31 by a sealant to seal the plurality of organic light emitting diodes (OLEDs).

The first substrate 31 may be formed of glass, a polymer film, metal, and the like, and a pixel circuit and the organic light emitting diode (OLED) are positioned on every pixel area of the first substrate 31. The pixel circuit includes at least two thin film transistors (a switching thin film transistor and a driving thin film transistor) and at least one capacitor. The organic light emitting diode (OLED) includes a pixel electrode 331, an organic light emitting layer 332, and a common electrode 333.

FIG. 4 illustrates only the driving thin film transistor 34 of the pixel circuit. The driving thin film transistor 34 includes an active layer 341, a gate electrode 342, and source/drain electrodes 343 and 344. The switching thin film transistor is used as a switching element selecting a pixel desired to be light-emitted, and the driving thin film transistor 34 applies driving power for making the organic light emitting layer 332 of the selected pixel emit light to the pixel electrode 331.

The pixel electrode 331 is individually positioned at every pixel, and is connected with the drain electrode 344 of the driving thin film transistor 34. In the meantime, the common electrode 333 is formed on the entire first substrate 31 without division for each pixel, and is connected with a power source ELVSS. Any one of the pixel electrode 331 and the common electrode 333 is an anode, and the other is a cathode. Holes injected from the anode and electrons injected from the cathode are combined in the organic light emitting layer 332 to generate an exciton, and light emission is performed while the exciton emits energy.

The pixel electrode 331 is formed of a transparent conductive layer, and the common electrode 333 may be formed of a metal layer. In this case, light of the organic light emitting layer 332 is reflected from the common electrode 333, and is discharged to the outside by penetrating through the pixel electrode 331 and the first substrate 31, so that the external surface of the first substrate 31 serves as the display surface of the display panel 30. The first substrate 31 includes a pad area, which does not overlap the second substrate 32, at an outer side of the display area, and the pad electrodes are exposed in the pad area, so that the first substrate 31 is connected with the tape package 100.

The second substrate 32 may be formed of glass, a polymer film, or the like. The second substrate 32, which is an encapsulation substrate, seals the organic light emitting diode (OLED) from an external environment including moisture and oxygen to suppress deterioration of the organic light emitting diode (OLED) due to moisture and oxygen.

Since the external surface of the first substrate 31 serves the display surface of the display panel 30, the tape package 100 fixed to the pad area of the first substrate 31 is bent toward an external surface (upper surface) of the second substrate 32. Accordingly, the printed circuit board 40 overlaps the second substrate 32 to prevent the display surface of the display panel 30 from being hidden.

The semiconductor chip 10, the wire pattern 22, and the solder resist 25 of the tape package 100 are positioned while facing toward the outside of the tape package 100. Further, a bent portion of the tape package 100 is a part of the output wire pattern 24 and the solder resist 25 covering the output wire pattern 24. The protective film 26 is positioned in the bent portion of the tape package 100, and covers and protects an edge portion of the solder resist facing the output wire pattern 24 and the part of the output wire pattern 24.

In this case, the protective film 26 strongly fixed to the tape wire substrate 20 by thermocompression bonding serves to improve force for fixing the edge portion of the solder resist 25 and the output wire pattern 24 to the base film 21, thereby suppressing generation of a crack of the solder resist 25 and the wire pattern 22. That is, the tape package 100 of the present exemplary embodiment includes the protective film 26, so that it is possible to solve vulnerability to the crack of the solder resist 25 and the output wire pattern 24 due to bending.

In the meantime, a conductive protection structure 46, such as a chassis, may be positioned outside the tape package 100. When it is assumed that there is no protection film 26, an edge of the solder resist 25 may peel off by the contact with the protection structure during a process of fastening the display panel 30 and the protection structure 46, and in this case, the wire pattern 22 is exposed to be in contact with the conductive protection structure 46, thereby causing a short circuit failure.

However, in the tape package 100 of the present exemplary embodiment, the protection film 26 protects the edge portion of the solder resist 25, so that it is possible to prevent peeling at the edge of the solder resist 25 due to the external contact during the process of fastening the display panel 30 and the protection structure 46. As a result, the short circuit failure due to the contact of the wire pattern 22 with the protection structure 46 may be fundamentally prevented.

Figure 5:
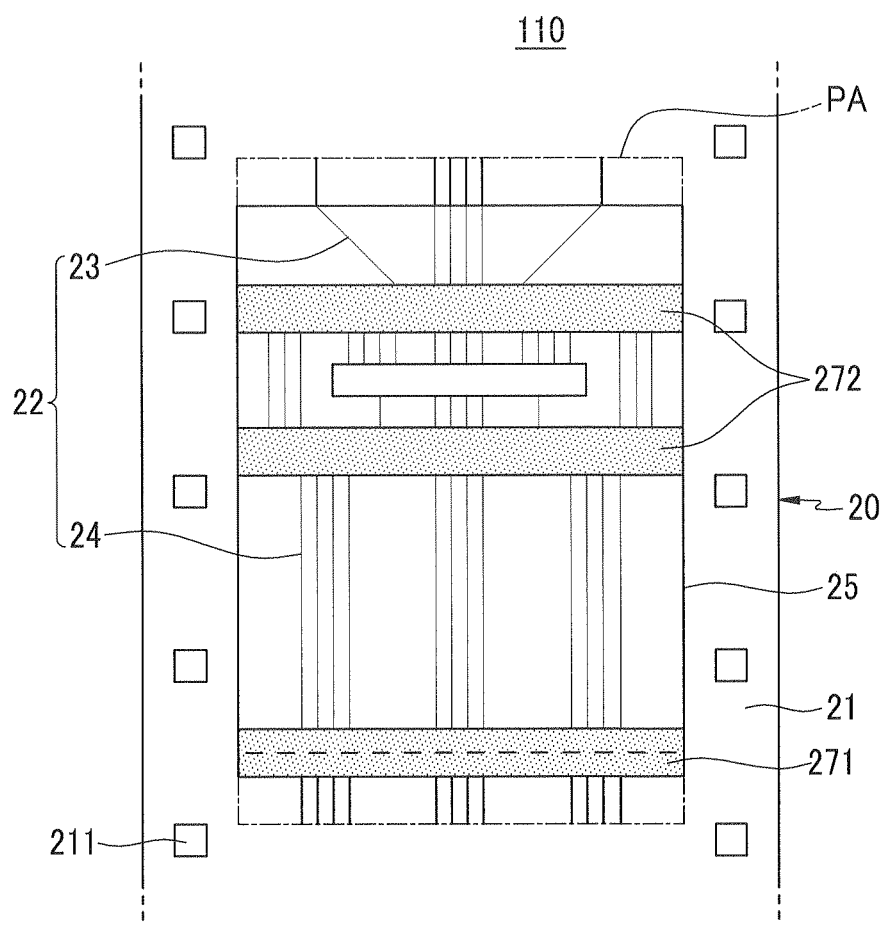
FIG. 5 is a top plan view illustrating a tape package according to a third exemplary embodiment.
Figure 6:
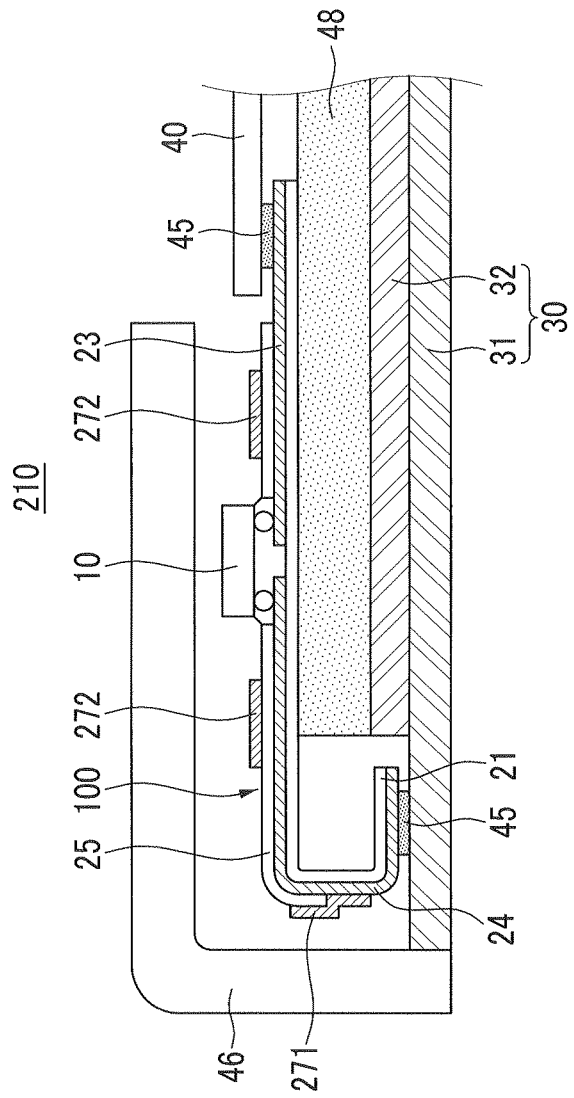
FIG. 6 is a cross-sectional view of a flat panel display device according to a fourth exemplary embodiment including the tape package illustrated in FIG. 5.

FIG. 5 is a top plan view illustrating a tape package according to a third exemplary embodiment, and FIG. 6 is a cross-sectional view of a flat panel display device according to a fourth exemplary embodiment including the tape package illustrated in FIG. 5.

In reference to FIGS. 5 and 6, the tape package 110 according to the third exemplary embodiment has the same configuration as that of the tape package of the aforementioned first exemplary embodiment, except that a plurality of protection films 271 and 272 is included. The same member as that of the first exemplary embodiment will be denoted with the same reference numeral, and the different configuration from that of the first exemplary embodiment will be mainly described below.

The protection films 271 and 272 in the tape package 110 of the third exemplary embodiment include the first protection film 271 covering an edge portion of the solder resist 25 facing the output wire pattern 24, and at least one second protection film 272 positioned so as to correspond to a fine pitch portion in the wire pattern 22. The second protection film 272 is formed of the same polymer material as that of the first protection film 271, and is simultaneously fixed to the tape wire substrate 20 together with the first protection film 271.

Each of the input wire pattern 23 and the output wire pattern 24 includes the fine pitch portion in which an interval between the wires becomes narrow, and one second protection film 272 may be provided for every fine pitch portion of the input wire pattern 23 and the output wire pattern 24. The second protection film 272 may be firmly fixed to the upper surface of the solder resist 25 so as to correspond to the fine pitch portion by thermocompression bonding.

The fine pitch portion of the wire pattern 22 is a portion, which is vulnerable to the crack together with the bent portion. In the tape package 110 of the third exemplary embodiment and the flat panel display device 210 of the fourth exemplary embodiment including the tape package 110, the fine pitch portion of the wire pattern 22 is protected by covering the fine pitch portion by using the second protection film 272, so that it is possible to prevent the generation of the crack in the fine pitch portion during a processing of manufacturing and treating the tape package 110, and assembling the tape package 110 with a display panel.

Figure 7:
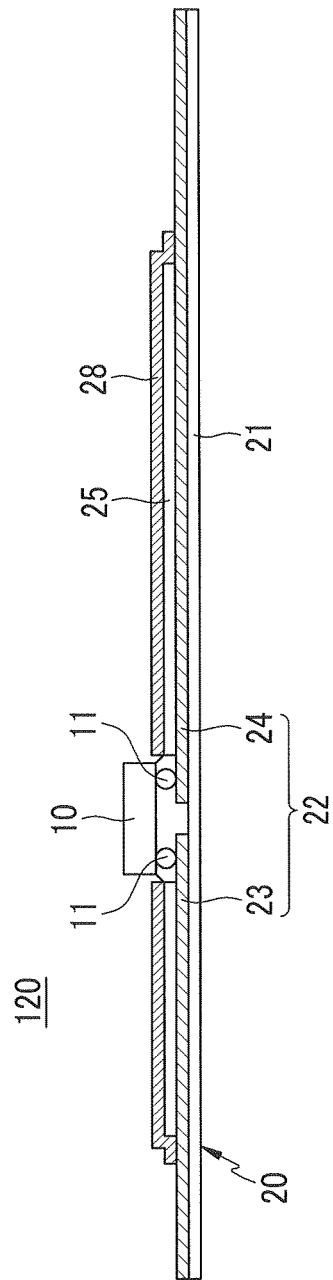
FIG. 7 is a cross-sectional view illustrating a tape package according to a fifth exemplary embodiment.
Figure 8:
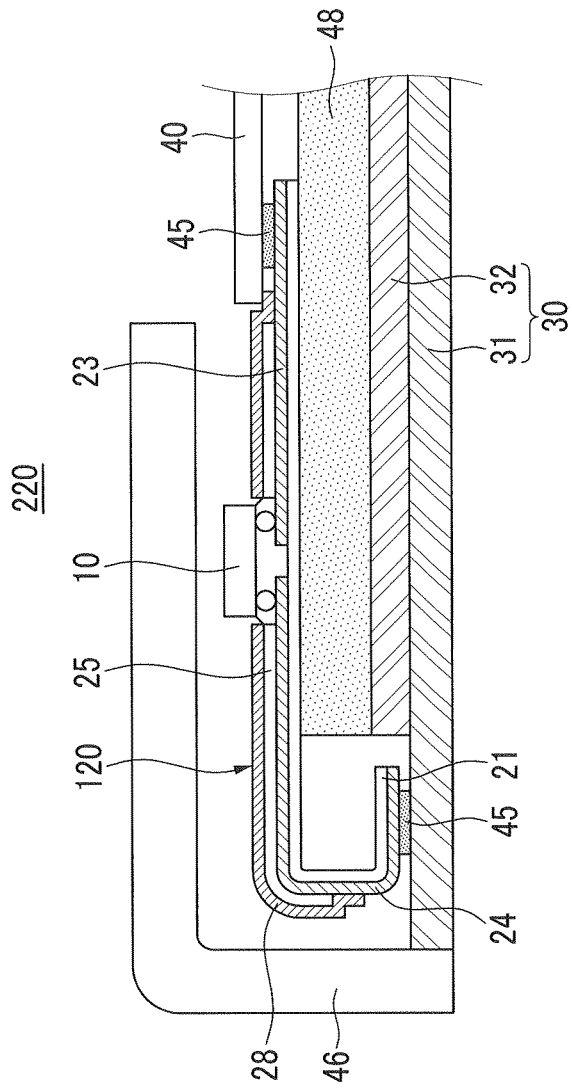
FIG. 8 is a cross-sectional view of a flat panel display device according to a sixth exemplary embodiment including the tape package illustrated in FIG. 7.

FIG. 7 is a cross-sectional view illustrating a tape package according to a fifth exemplary embodiment, and FIG. 8 is a cross-sectional view of a flat panel display device according to a sixth exemplary embodiment including the tape package illustrated in FIG. 7.

In reference to FIGS. 7 and 8, the tape package 120 of the fifth exemplary embodiment has the same configuration as that of the tape package of the aforementioned first exemplary embodiment, except that the protection film 28 is formed in the entire tape wire substrate 20, except for the ends of the semiconductor chip 10 and the wire pattern 22. The same member as that of the first exemplary embodiment will be denoted with the same reference numeral, and the different configuration from that of the first exemplary embodiment will be mainly described below.

The protection film 28 in the tape package 120 of the fifth exemplary embodiment is fixed to an entire upper surface of the solder resist 25 by thermocompression bonding. The protection film 28 is formed so as to have a larger width than that of the solder resist 25 in a lengthwise direction of the wire pattern 22, so that the protection film 28 covers and protects an upper surface and a side surface of the solder resist 25 together with a part of the input wire pattern 23 and a part of the output wire pattern 24.

The protection film 28 covers the entire solder resist 25 and is strongly fixed to the tape wire substrate 20 by thermocompression bonding, so that it is possible to prevent a crack of the solder resist 25 and the wire pattern, and also effectively prevent a short circuit failure of the wire pattern 22 and the protection structure 46 due to peeling at the solder resist 25.

According to the exemplary embodiments, it is possible to solve vulnerability to a crack of the solder resist and the output wire pattern due to bending by providing the protection film in the tape package. Further, it is possible to suppress peeling at the edge of the solder resist due to an external contact during a process of fastening the display panel and the protection structure, and it is possible to prevent a short circuit failure due to a contact of the wire pattern with the protection structure.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

| <Description of symbols> | |
| --- | --- |
| 100, 110, 120: Tape package | 200, 210, 22: Flat panel display device |
| 10: Semiconductor chip | 20: Tape wire substrate |
| 21: Base film | 22: Wire pattern |
| 25: Solder resist | 26, 28: Protection film |
| 271: First protection film | 272: Second protection film |

What is claimed is:

1. A tape package, comprising:
a base film;
a semiconductor chip mounted on one surface of the base film;
a wire pattern including an input wire pattern and an output wire pattern formed on the one surface of the base film and electrically connected with the semiconductor chip;
a solder resist covering the wire pattern and exposing an end of the wire pattern; and
an electrically insulating protection film provided on an edge at one side of the solder resist facing an end of the output wire pattern, the protection film positioned through an upper surface and a side surface of the solder resist and an upper surface of the base film.

2. The tape package of claim 1, wherein:
the protection film has a same length as that of the edge at the one side of the solder resist.

3. The tape package of claim 2, wherein:
the base film is bent so that the one surface on which the wire pattern and the solder resist are formed faces an exterior of the tape package, and
at least a part of the protection film is positioned at a bent portion of the base film.

4. The tape package of claim 1, wherein:
the protection film includes:
a first protection film provided on the edge at one side of the solder resist facing the end of the output wire pattern; and
a second protection film provided on the solder resist so as to correspond to a fine pitch portion of the wire pattern.

5. The tape package of claim 4, wherein:
the fine pitch portion is included in each of the input wire pattern and the output wire pattern, and the second protection film is individually positioned at each fine pitch portion.

6. The tape package of claim 1, wherein:
the protection film is provided on an entire upper surface of the solder resist.

7. The tape package of claim 6, wherein:
the protection film is formed to have a larger width than that of the solder resist in a lengthwise direction of the wire pattern to cover a part of the input wire pattern and the output wire pattern.

8. The tape package of claim 1, wherein:
the protection film is integrally fixed to the solder resist and the base film by thermocompression bonding.

9. A flat panel display device, comprising:
a display panel including a first substrate and a second substrate;
a printed circuit board configured to transmit a control signal to the display panel; and
a tape package having one end bonded to the first substrate and the other end bonded to the printed circuit board, and bent toward an external surface of the second substrate so that the printed circuit board faces the second substrate, the tape package comprising a base film including a wire pattern, a semiconductor chip, and a solder resist on one surface facing an exterior of the tape package, and an electrically insulating protection film covering an edge at one side of the solder resist at a bent portion of the base film.

10. The flat panel display device of claim 9, wherein:
the wire pattern includes an input wire pattern electrically connected with the printed circuit board, and an output wire pattern electrically connected with the display panel, and
the protection film is provided on the edge at one side of the solder resist facing an end of the output wire pattern.

11. The flat panel display device of claim 10, wherein:
the protection film includes:
a first protection pattern provided on the edge at one side of the solder resist facing the end of the output wire pattern; and
a second protection film provided on the solder resist so as to correspond to a fine pitch portion of the wire pattern.

12. The flat panel display device of claim 11, wherein:
the fine pitch portion is included in each of the input wire pattern and the output wire pattern, and the second protection film is individually positioned on the every fine pitch portion.

13. The flat panel display device of claim 10, wherein:
the protection film is provided on an entire external surface of the solder resist.

14. The flat panel display device of claim 13, wherein:
the protection film is formed to have a larger width than that of the solder resist in a lengthwise direction of the wire pattern to cover a part of the input wire pattern and the output wire pattern.

15. The flat panel display device of claim 9, wherein:
the protection film is integrally fixed to the solder resist and the base film by thermocompression bonding.

16. The flat panel display device of claim 9, wherein:
the display panel is an organic light emitting display panel including a plurality of organic light emitting diodes (OLED).

* * * * *